(12) United States Patent
Wu et al.

(10) Patent No.: US 7,741,651 B2
(45) Date of Patent: Jun. 22, 2010

(54) LIGHT EMITTING DIODE

(75) Inventors: Chia-Hao Wu, Taipei (TW); Tien-Yu Lee, Taipei (TW)

(73) Assignee: Lite-On Technology Corp., Taipei (TW)

( * ) Notice: Subject to any disclaimer, the term of this patent is extended or adjusted under 35 U.S.C. 154(b) by 337 days.

(21) Appl. No.: 11/878,181

(22) Filed: Jul. 23, 2007

(65) Prior Publication Data

US 2008/0272385 A1 Nov. 6, 2008

(30) Foreign Application Priority Data

May 4, 2007 (TW) .............................. 96115904 A

(51) Int. Cl.
*H01L 33/00* (2010.01)
*H01L 21/00* (2010.01)
(52) U.S. Cl. .......................................... 257/98; 438/29
(58) Field of Classification Search ................... 257/98, 257/680, E23.18, E25.028, E25.032, E33.001–E33.077; 438/22–29
See application file for complete search history.

(56) References Cited

U.S. PATENT DOCUMENTS

| 5,959,316 | A | 9/1999 | Lowery |
| 6,417,019 | B1 | 7/2002 | Mueller et al. |
| 6,576,488 | B2 | 6/2003 | Collins, III et al. |
| 6,650,044 | B1 | 11/2003 | Lowery |
| 2006/0082296 | A1* | 4/2006 | Chua et al. ................... 313/512 |
| 2007/0102717 | A1* | 5/2007 | Lee et al. ...................... 257/98 |

* cited by examiner

*Primary Examiner*—Calvin Lee
(74) *Attorney, Agent, or Firm*—Rosenberg, Klein & Lee

(57) ABSTRACT

A light emitting diode includes a base, a light emitting chip, and a wavelength converting layer. The base is formed with a recessed portion that has a bottom wall surface, and a side wall surface extending upwardly from the bottom wall surface and cooperating with the bottom wall surface to define a receiving space. The light emitting chip is provided on the bottom wall surface of the receiving space, and has a top chip surface disposed below a top surface of the base, and a peripheral chip surface extending downwardly from the top chip surface and being substantially parallel to and forming a gap with the side wall surface of the recessed portion. The wavelength converting layer is filled in the receiving space in the recessed portion so as to cover the top chip surface and the peripheral chip surface of the light emitting chip.

14 Claims, 4 Drawing Sheets

US 7,741,651 B2

LIGHT EMITTING DIODE

CROSS-REFERENCE TO RELATED APPLICATION

This application claims priority of Taiwanese Application No. 096115904, filed on May 4, 2007.

BACKGROUND OF THE INVENTION

1. Field of the Invention

The invention relates to a light emitting device, more particularly to a light emitting diode.

2. Description of the Related Art

As shown in FIG. 1, a conventional light emitting diode includes a base 11 formed with a recessed portion 111, a light emitting chip 12 provided on a bottom wall surface of the recessed portion 111 and having a top chip surface and a peripheral chip surface, and a fluorescent layer 13 filled in the recessed portion 111 so as to cover the top chip surface and the peripheral chip surface of the light emitting chip 12. The fluorescent layer 13 contains phosphor particles 131 for converting a part of blue light emitted from the light emitting chip 12 into yellow light, so that the mix of blue and yellow light results in white light. However, since light (L2) emitted from the peripheral chip surface travels in the fluorescent layer 13 longer than light (L1) emitted from the top chip surface, the light (L2) is more likely to be converted into yellow light than the light (L1), thereby making the light obtained from the conventional light emitting diode yellowwish.

U.S. Pat. No. 5,959,316 discloses another conventional light emitting diode (see FIG. 2) that eliminates the aforementioned drawback by first covering the top chip surface and the peripheral chip surface of the light emitting chip 12 with a transparent spacer 14, and then disposing the fluorescent layer 13 to cover the transparent spacer 14. Since the fluorescent layer 13 has a uniform thickness, light emitted from different parts of the light emitting chip will be eventually converted to obtain output light that is less yellowish.

Moreover, U.S. Pat. Nos. 6,576,488, 6,417,019 and 6,650,044 disclose methods such as electrophoresis and stenciling to manufacture still another conventional light emitting diode (see FIG. 3) including the fluorescent layer 13 that has a uniform thickness and that is disposed to directly cover the top chip surface and the peripheral chip surface of the light emitting chip 12. However, these methods can only be applied to the light emitting chip 12 that is mounted to the base 11 via chip bonding process (see FIG. 4) rather than wire bonding process. Furthermore, these methods lead to higher manufacturing costs, thereby impeding the popularity of the conventional light emitting diode.

SUMMARY OF THE INVENTION

Therefore, the object of the present invention is to provide a light emitting diode that can avoid color deviation of light obtained therefrom.

Accordingly, a light emitting diode of the present invention comprises a base, a light emitting chip, and a wavelength converting layer. The base has a top surface and is formed with a recessed portion that is indented from the top surface. The recessed portion has a bottom wall surface having a periphery, and a side wall surface extending upwardly from the periphery of the bottom wall surface to the top surface of the base and cooperating with the bottom wall surface to define a receiving space. The light emitting chip is provided in the receiving space and is disposed on the bottom wall surface of the recessed portion such that a geometric center of the light emitting chip coincides with that of the bottom wall surface of the recessed portion. The light emitting chip has a top chip surface that is disposed below the top surface of the base, and a peripheral chip surface that extends downwardly from the top chip surface to the bottom wall surface of the recessed portion, and that is substantially parallel to and that forms a gap with the side wall surface of the recessed portion. The wavelength converting layer is filled in the receiving space in the recessed portion so as to cover the top chip surface and the peripheral chip surface of the light emitting chip.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
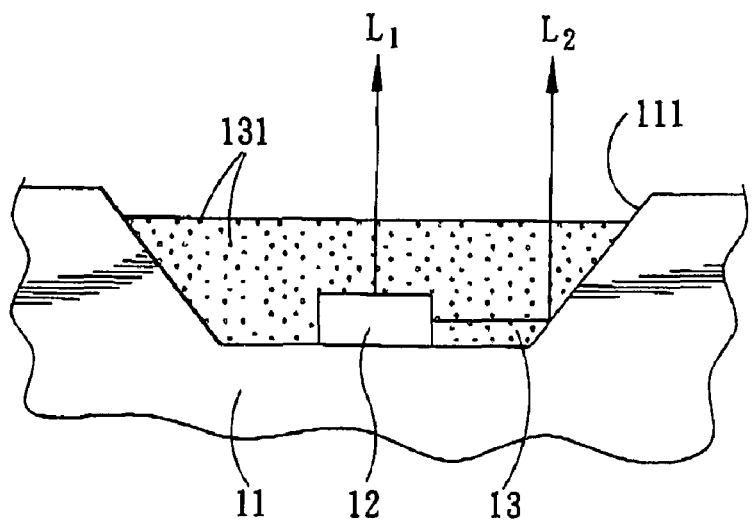
FIG. 1 is a schematic side view of a conventional light emitting diode.
Figure 2:
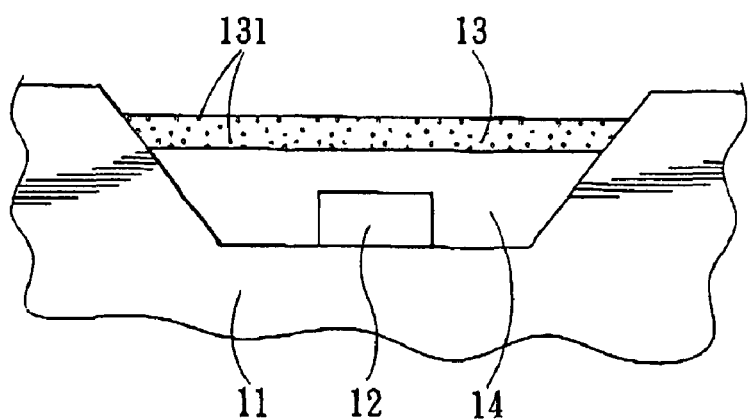
FIG. 2 is a schematic side view of another conventional light emitting diode.
Figure 3:
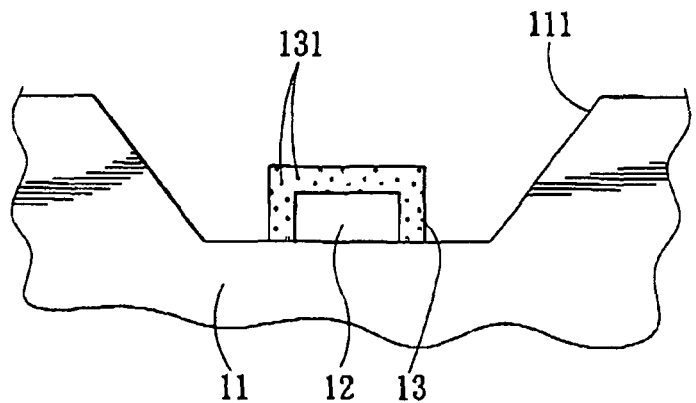
FIG. 3 is a schematic side view of still another conventional light emitting diode.
Figure 4:
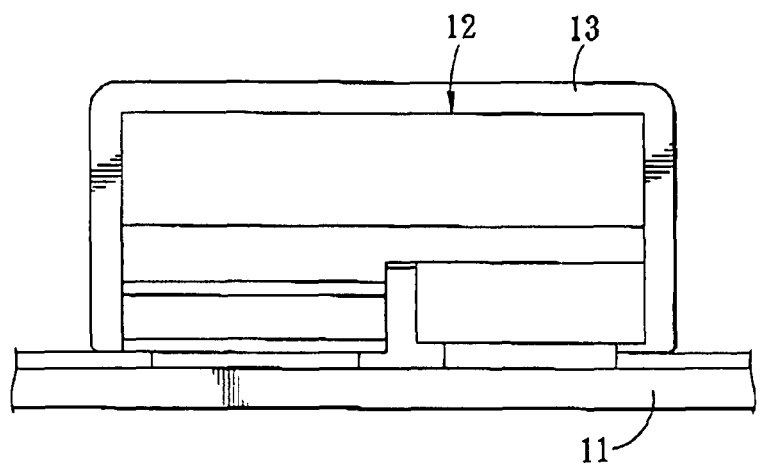
FIG. 4 is a schematic side view of yet another conventional light emitting diode.
Figure 5:
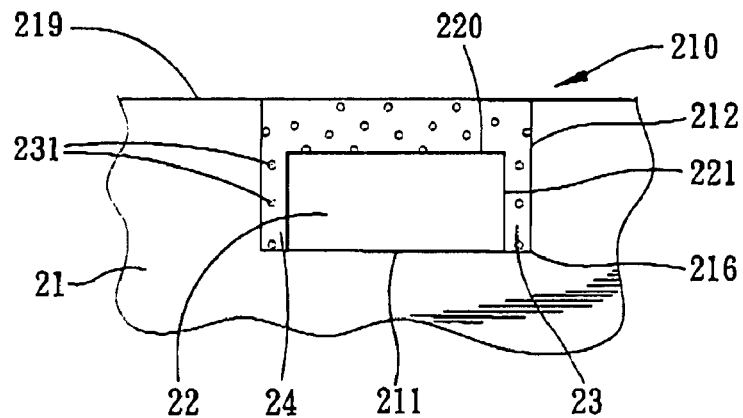
FIG. 5 is a schematic side view of a preferred embodiment of a light emitting diode according to the invention.
Figure 6:
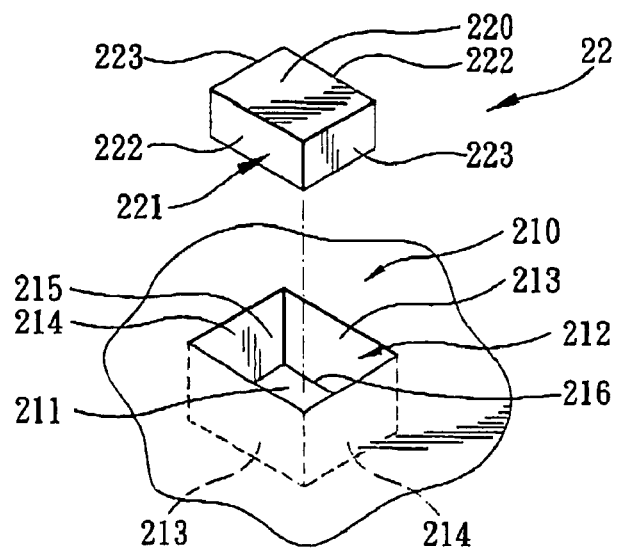
FIG. 6 is an exploded perspective view of the preferred embodiment.

As shown in FIGS. 5 and 6, the preferred embodiment of a light emitting diode according to the present invention comprises a base 21, a light emitting chip 22, and a wavelength converting layer 23.

The base 21 has a top surface 219, and is formed with a recessed portion 210 that is indented from the top surface 219. The recessed portion 210 has a bottom wall surface 211 having a periphery 216, and a side wall surface 212 extending upwardly from the periphery 216 of the bottom wall surface 211 to the top surface 219 of the base 21 and cooperating with the bottom wall surface 211 to define a receiving space 215.

The light emitting chip 22 is provided in the receiving space 215 and is disposed on the bottom wall surface 211 of the recessed portion 210 such that a geometric center of the light emitting chip 12 coincides with that of the bottom wall surface 211 of the recessed portion 210. The light emitting chip 22 has a top chip surface 220 that is disposed below the top surface 219 of the base 21, and a peripheral chip surface 221 that extends downwardly from the top chip surface 220 to the bottom wall surface 211, and that is substantially parallel to and that forms a gap 24 with the side wall surface 212 of the recessed portion 210.

The wavelength converting layer 23 is filled in the receiving space 215 in the recessed portion 210 so as to cover the top chip surface 220 and the peripheral chip surface 221 of the light emitting chip 22.

Figure 7:
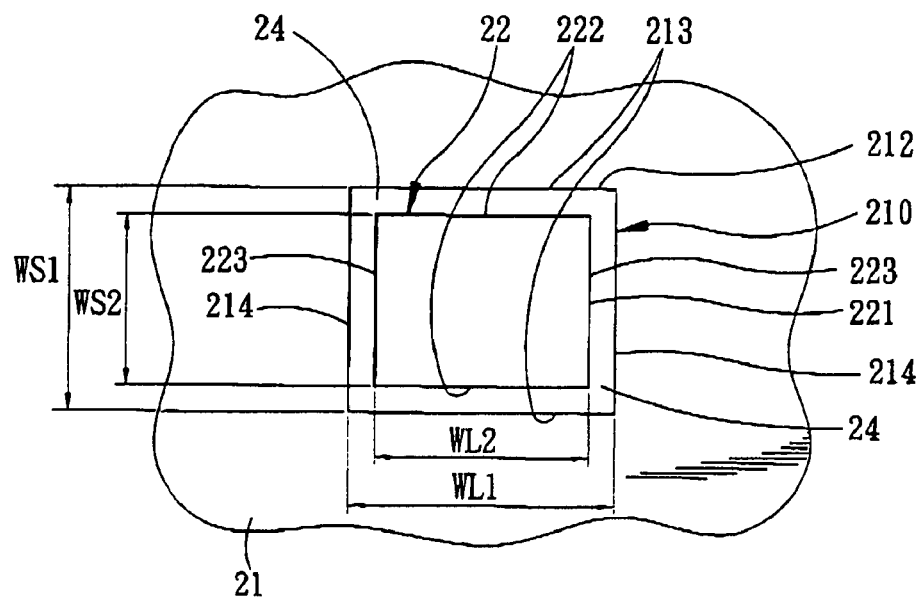
FIG. 7 is a schematic top view of the preferred embodiment.

The recessed portion 210 is rectangular in this embodiment, i.e., the side wall surface 212 thereof has a pair of parallel first surface parts 213 and a pair of parallel second surface parts 214 that extend between the first surface parts 213, and the side wall surface 212 is substantially perpendicular to the bottom wall surface 211. In this embodiment, as shown in FIG. 6, since the light emitting chip 22 is diced from a wafer that has a uniform thickness and is diced along the thickness direction of the wafer, the light emitting chip 22 is also rectangular. As further shown in FIG. 7, the peripheral chip surface 221 of the light emitting chip 22 has a pair of parallel first surface portions 222 that are disposed parallel to the first surface parts 213 of the side wall surface 212, and a pair of parallel second surface portions 223 that extend between the first surface portions 222 and that are disposed parallel to the second surface parts 214 of the side wall surface 212. Each of the first surface parts 213 has a first length (WL1) transverse to the second surface parts 214. Each of the second surface parts 214 has a second length (WS1) transverse to the first surface parts 213. Each of the first surface portions 222 has a third length (WL2) transverse to the second surface portions 223. Each of the second surface portions 223 has a fourth length (WS2) transverse to the first surface portions 222. The first length (WL1) has a difference with the third length (WL2) that is less than 0.6 millimeters, and the second length (WS1) has a difference with the fourth length (WS2) that is less than 0.6 millimeters. In this embodiment, the difference between the first length (WL1) and the third length (WL2) is 0.4 millimeters, and the difference between the second length (WS1) and the fourth length (WS2) is also 0.4 millimeters.

As shown in FIG. 5, the base 21 is one of a metallic substrate (e.g., a lead frame), a printed circuit board, a ceramic substrate, a plastic substrate, and any other substrate made of materials that can be suitably processed. The recessed portion 210 is processed in different ways according to the material from which the base 21 is made.

The light emitting chip 22 can be one that is configured for wire bonding or flip chip bonding. In this embodiment, by virtue of a pair of metallic electrodes (not shown) thereof electrically connected to an external power source, the chip 22 is driven to emit blue light with a wavelength between 400 nm to 470 nm.

In this embodiment, the wavelength converting layer 23 is a fluorescent layer containing a transparent plastic such as silicone or epoxy resin, and phosphor particles 231 for converting the blue light emitted from the top chip surface 220 of the light emitting chip 22 into yellow light that has a wavelength between 520 nm and 570 nm. In other embodiments of the invention, the light emitting diode can comprise a chip that emits ultraviolet light having a wavelength between 300 nm to 400 nm, and a fluorescent layer that includes phosphor particles emitting red light having a wavelength between 590 nm and 650 nm, green light having a wavelength between 500 nm and 530 nm, and blue light having a wavelength between 440 nm and 480 nm to result in white light.

Figure 8:
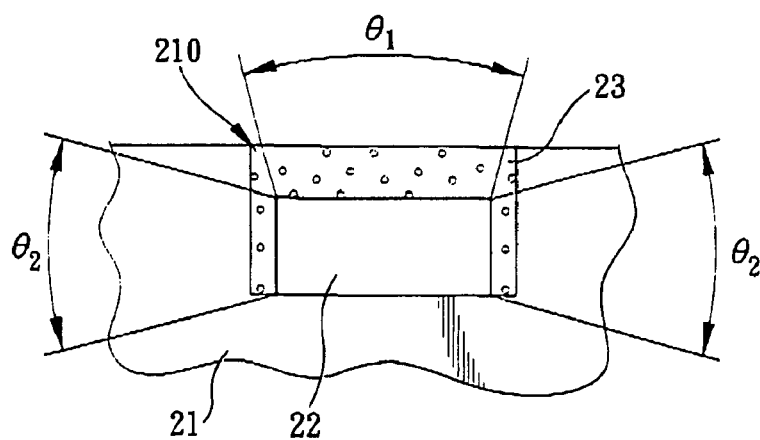
FIG. 8 is a schematic side view of the preferred embodiment.

Since the semiconductor material of the light emitting chip 22 has a refractive index greater than that of the transparent plastic of the wavelength converting layer 23, if photons generated from the active layer of the light emitting chip 22 move outwardly of the top chip surface 220 and the peripheral chip surface 221 of the light emitting chip 22 at an angle greater than the critical angle of total reflection, the photons will be totally reflected inwardly of the light emitting chip 22 instead of passing through the light emitting chip 22 into the wavelength converting layer 23. Therefore, photons pass through the top chip surface 220 mostly in directions within a first angular range $\theta 1$ (see FIG. 8), and pass through the peripheral chip surface 221 mostly in directions within a second angular range $\theta 2$ (see FIG. 8).

Since the wavelength converting layer 23 has a uniform thickness at the part covering the top chip surface 220 of the light emitting chip 22 within the first angular range $\theta 1$, the characteristics of the converted portion of light through the wavelength converting layer 23 within the first angular range $\theta 1$ will be substantially the same. As the side wall surface 212 of the recessed portion 210 of the base 21 is disposed parallel to the peripheral chip surface 221 of the light emitting chip 22, most light within the second angular range $\theta 2$ and emitted from the light emitting chip 22 into the wavelength converting layer 23 will undergo multiple reflections inside the wavelength converting layer 23 between the side wall surface 212 of the recessed portion 210 and the peripheral chip surface 221 of the light emitting chip 22, or will be absorbed by the materials of the wavelength converting layer 23 and the light emitting chip 22 for transformation into another form of energy. Therefore, the effect of light emitted from the peripheral chip surface 221 upon light emitted from the top chip surface 220 can be effectively reduced without incurring higher manufacturing costs.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. A light emitting diode comprising:
   a base having a top surface and formed with a recessed portion indented from said top surface, said recessed portion having a bottom wall surface having a periphery, and a side wall surface extending upwardly from said periphery of said bottom wall surface to said top surface of said base and cooperating with said bottom wall surface to define a receiving space;
   a light emitting chip provided in said receiving space and disposed on said bottom wall surface of said recessed portion such that a geometric center of said light emitting chip coincides with that of said bottom wall surface of said recessed portion, said light emitting chip having a top chip surface disposed below said top surface of said base, and a peripheral chip surface extending downwardly from said top chip surface to said bottom wall surface of said recessed portion to extend substantially parallel to said side wall surface of said recessed portion, said peripheral chip surface being along at least one segment thereof uniformly spaced from said side wall surface by a predetermined gap; and
   a wavelength converting layer filled in said receiving space in said recessed portion so as to cover said top chip surface and said peripheral chip surface of said light emitting chip; whereby light emitted through said peripheral chip surface is substantially dissipated within said gap for minimal effect upon light emitted through said top chip surface.

2. The light emitting diode as claimed in claim 1, wherein:
   said recessed portion is rectangular, and said side wall surface of said recessed portion has a pair of parallel first surface parts, and a pair of parallel second surface parts extending between said first surface parts; and
   said peripheral chip surface of said light emitting chip has a pair of parallel first surface portions disposed parallel to said first surface parts of said side wall surface of said recessed portion, and a pair of parallel second surface portions extending between said first surface portions and disposed parallel to said second surface parts of said side wall surface of said recessed portion.

3. The light emitting diode as claimed in claim 2, wherein:
each of said first surface parts has a first length transverse to said second surface parts;
each of said second surface parts has a second length transverse to said first surface parts;
each of said first surface portions has a third length transverse to said second surface portions;
each of said second surface portions has a fourth length transverse to said first surface portions;
said first length having a difference with said third length less than 0.6 millimeters; and
said second length having a difference with said fourth length less than 0.6 millimeters.

4. The light emitting diode as claimed in claim 1, wherein said base is one of a metallic substrate, a printed circuit board, a ceramic substrate, and a plastic substrate.

5. The light emitting diode as claimed in claim 1, wherein said side wall surface of said recessed portion is substantially perpendicular to said bottom wall surface.

6. The light emitting diode as claimed in claim 1, wherein said wavelength converting layer is for converting light emitted from said top chip surface of said light emitting chip to result in white light.

7. The light emitting diode as claimed in claim 6, wherein said wavelength converting layer contains a transparent plastic and phosphor particles.

8. The light emitting diode as claimed in claim 1, wherein said wavelength converting layer is a fluorescent layer.

9. A light emitting diode comprising:
a base having a top surface and formed with a rectangular recessed portion indented from said top surface, said recessed portion having a bottom wall surface having a periphery, and
a side wall surface extending upwardly and perpendicularly from said periphery of said bottom wall surface to said top surface of said base and cooperating with said bottom wall surface to define a receiving space;
a light emitting chip provided in said receiving space and disposed on said bottom wall surface of said recessed portion, said light emitting chip having a top chip surface disposed below said top surface of said base, and a peripheral chip surface extending downwardly from said top chip surface to said bottom wall surface of said recessed portion to extend substantially parallel to said side wall surface of said recessed portion, said peripheral chip surface being along at least one segment thereof uniformly spaced by a predetermined gap from said side wall surface of said recessed portion, said gap surrounding said peripheral chip surface of said light emitting chip; and
a wavelength converting layer filled in said receiving space in said recessed portion so as to cover said top chip surface and said peripheral chip surface of said light emitting chip; whereby light emitted through said peripheral chip surface is substantially dissipated within said gap for minimal effect upon light emitted through said top chip surface.

10. A base adapted for a light emitting diode that includes a light emitting chip having a top chip surface and a peripheral chip surface extending from the top chip surface, and that further includes a wavelength converting layer, said base comprising:
a base body having a top surface and formed with a recessed portion indented from said top surface, said recessed portion having a bottom wall surface having a periphery, and
a side wall surface extending upwardly from said periphery of said bottom wall surface to said top surface of said base and cooperating with said bottom wall surface to define a receiving space;
said receiving space being configured for receiving the light emitting chip therein such that said bottom wall surface of said recessed portion receives the light emitting chip thereon in a manner that a geometric center of the light emitting chip coincides with that of said bottom wall surface of said recessed portion, such that said top surface of said base body is disposed above the top chip surface of the light emitting chip, and such that said side wall surface of said recessed portion is substantially parallel to and forms a predetermined gap with the peripheral chip surface of the light emitting chip, the peripheral chip surface of the light emitting chip thereby being along at least one segment thereof uniformly spaced from said side wall surface by said gap;
said receiving space being adapted to be filled with the wavelength converting layer to cover the top chip surface and the peripheral chip surface of the light emitting chip; whereby light emitted through said peripheral chip surface is substantially dissipated within said gap for minimal effect upon light emitted through said top chip surface.

11. The base as claimed in claim 10, the peripheral chip surface of the light emitting chip being rectangular and having a pair of parallel first surface portions, and a pair of parallel second surface portions that extend between the first surface portions, wherein:
said side wall surface of said recessed portion has a pair of parallel first surface parts adapted to be disposed parallel to the first surface portions, and a pair of parallel second surface parts that extend between said first surface parts and adapted to be disposed parallel to the second surface portions.

12. The base as claimed in claim 11, wherein:
each of said first surface parts has a first length transverse to said second surface parts;
each of said second surface parts has a second length transverse to said first surface parts;
said first length having a difference with a corresponding third length of each of the first surface portions that is less than 0.6 millimeters; and
said second length having a difference with a corresponding fourth length of each of the second surface portions that is less than 0.6 millimeters.

13. The base as claimed in claim 10, wherein said base body is one of a metallic substrate, a printed circuit board, a ceramic substrate, and a plastic substrate.

14. The base as claimed in claim 10, wherein said side wall surface of said recessed portion is substantially perpendicular to said bottom wall surface.

* * * * *